United States Patent
Choi et al.

(10) Patent No.: US 9,923,144 B2
(45) Date of Patent: Mar. 20, 2018

(54) PHOTOACTIVE LAYER, ORGANIC SOLAR CELL COMPRISING SAME, AND MANUFACTURING METHOD THEREFOR

(71) Applicants: LG CHEM, LTD., Seoul (KR); POSTECH ACADEMY-INDUSTRY FOUNDATION, Pohang-si (KR)

(72) Inventors: Jeong Min Choi, Daejeon (KR); Byungjoon Moon, Pohang-si (KR); Gang-Young Lee, Pohang-si (KR); Jaechol Lee, Daejeon (KR); Taiho Park, Pohang-si (KR); Hangken Lee, Daejeon (KR); Jinseck Kim, Daejeon (KR); Songrim Jang, Daejeon (KR)

(73) Assignees: LG CHEM, LTD., Seoul (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 14/889,315

(22) PCT Filed: May 12, 2014

(86) PCT No.: PCT/KR2014/004220
§ 371 (c)(1),
(2) Date: Nov. 5, 2015

(87) PCT Pub. No.: WO2014/182139
PCT Pub. Date: Nov. 13, 2014

(65) Prior Publication Data
US 2016/0087214 A1    Mar. 24, 2016

(30) Foreign Application Priority Data
May 10, 2013 (KR) .................. 10-2013-0053376

(51) Int. Cl.
H01L 51/00  (2006.01)
H01L 51/42  (2006.01)
H01L 51/44  (2006.01)

(52) U.S. Cl.
CPC ...... H01L 51/0051 (2013.01); H01L 51/0036 (2013.01); H01L 51/0047 (2013.01);
(Continued)

(58) Field of Classification Search
CPC ............ H01L 51/0051; H01L 51/0036; H01L 51/0047; H01L 51/4253
See application file for complete search history.

(56) References Cited

U.S. PATENT DOCUMENTS

| | | |
|---|---|---|
| 2005/0255334 A1 | 11/2005 | Kang et al. |
| 2008/0149879 A1 | 6/2008 | Brand et al. |

(Continued)

FOREIGN PATENT DOCUMENTS

| | | |
|---|---|---|
| JP | 2006-162842 A | 6/2006 |
| JP | 2008-510868 A | 4/2008 |

(Continued)

OTHER PUBLICATIONS

Moon et al., "In situ modulation of the vertical distribution in a blend of P3HT and PC60BM via the addition of a composition gradient inducer," Nanoscale 2014, 6, 2440-2446.*

*Primary Examiner* — Catherine S Branch
(74) *Attorney, Agent, or Firm* — Dentons US LLP

(57) ABSTRACT

The present specification relates to a photoactive layer comprising an electron acceptor, an electron donor, and a compound comprising a functional group decreasing surface energy, an organic photovoltaic cell comprising the same, and a manufacturing method thereof.

13 Claims, 1 Drawing Sheet

(52) U.S. Cl.
CPC ...... *H01L 51/4253* (2013.01); *H01L 51/0097* (2013.01); *H01L 51/4293* (2013.01); *H01L 51/441* (2013.01); *Y02E 10/549* (2013.01); *Y02P 70/521* (2015.11)

(56) References Cited

U.S. PATENT DOCUMENTS

| 2010/0213454 | A1 | 8/2010 | Lang et al. |
| 2012/0205615 | A1 | 8/2012 | Seike et al. |
| 2012/0298974 | A1 | 11/2012 | Lee et al. |
| 2013/0098449 | A1 | 4/2013 | Okubo et al. |

FOREIGN PATENT DOCUMENTS

| JP | 2008-531777 | A | 8/2008 |
| JP | 2010-258143 | A | 11/2010 |
| JP | 2011-91131 | A | 5/2011 |
| JP | 2011-140480 | A | 7/2011 |
| KR | 10-2007-0101430 | A | 10/2007 |
| KR | 10-2010-0094475 | A | 8/2010 |
| KR | 10-2012-0132656 | A | 12/2012 |
| KR | 10-2013-0044663 | A | 5/2013 |
| TW | 200601891 | A | 1/2006 |
| TW | I265753 | B | 11/2006 |
| TW | 200933951 | A | 8/2009 |
| WO | 2006/021529 | A1 | 3/2006 |
| WO | 2009/113450 | A1 | 9/2009 |
| WO | 2012/142469 | A1 | 10/2012 |

\* cited by examiner

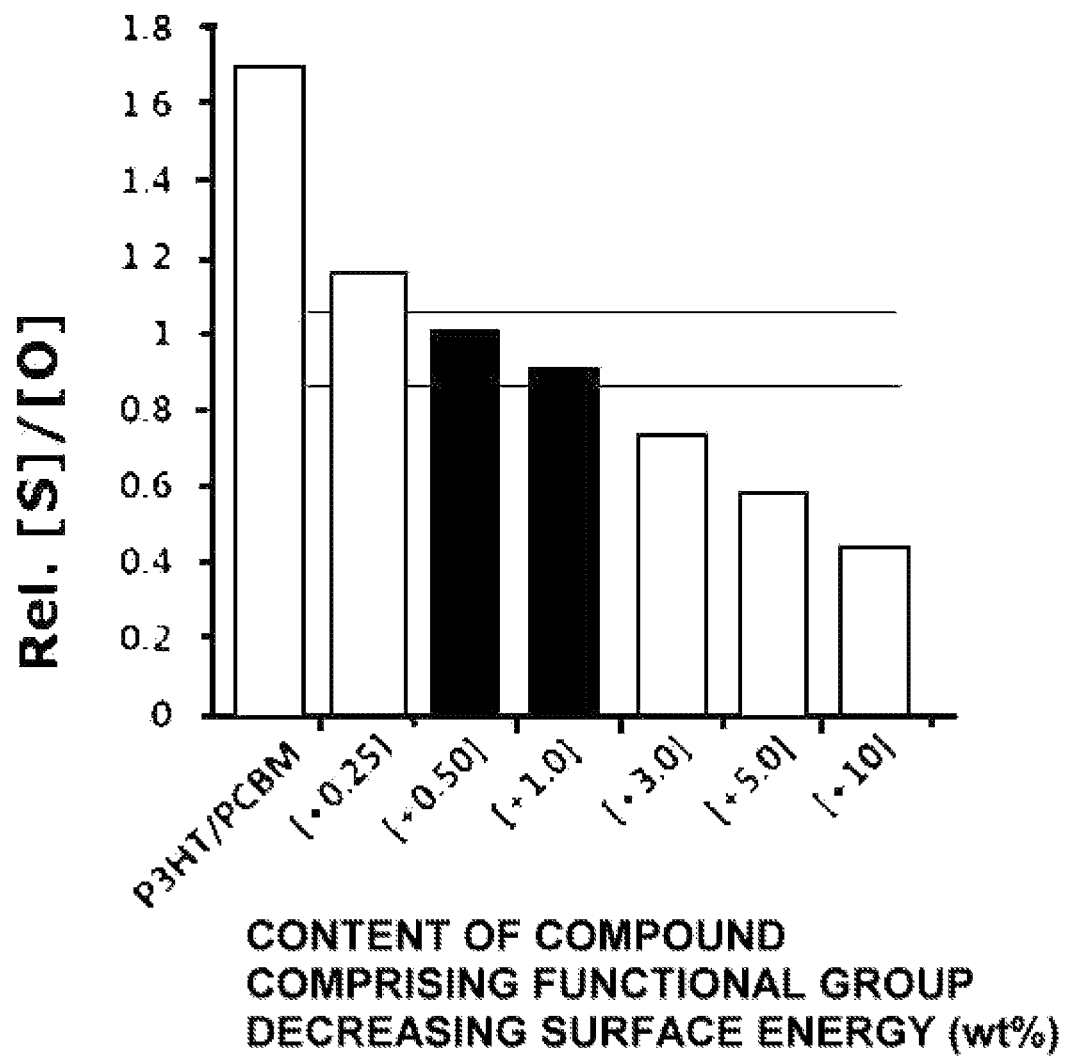

PHOTOACTIVE LAYER, ORGANIC SOLAR CELL COMPRISING SAME, AND MANUFACTURING METHOD THEREFOR

This application is a National Stage Entry of International Application No. PCT/KR2014/004220, filed May 12, 2014, which application claims the benefit and priority to Korean Application No. 10-2013-0053376, filed May 10, 2013, both of which are incorporated by reference in their entirety for all purposes as if fully set forth herein.

TECHNICAL FIELD

The present specification relates to a photoactive layer, an organic photovoltaic cell comprising the same, and a manufacturing method thereof.

This specification claims priority to and the benefit of Korean Patent Application No. 10-2013-0053376, filed in the Korean Intellectual Property Office on May 10, 2013, the entire contents of which are incorporated herein by reference.

BACKGROUND ART

Photovoltaic cells are re-evaluated from the viewpoint of global environmental conservation due to the advantage of no pollution, and studies on photovoltaic cells as a next-generation clean energy source have been actively conducted.

As types of photovoltaic cells known until now, there are many various types such as a compound semiconductor solar cell, a dye-sensitized solar cell and an organic polymer solar cell, including a solar cell using single-crystalline or polycrystalline bulk silicon and a thin-film type solar cell using amorphous, microcrystalline or polycrystalline silicon.

A solar cell using the commercially available single-crystalline bulk silicon in the related art has not been actively utilized due to high manufacturing cost and installation costs.

In order to solve the cost problem, studies on a thin-film type solar cell using organic materials have been conducted, and various attempts for manufacturing a high-efficiency photovoltaic cell have been proposed.

The organic thin-film photovoltaic cell technology, which is a technology in which solar energy is converted into electrical energy using a polymer or low-molecular organic semiconductor, is a next-generation technology all including ultra-low price and versatile mass production characteristics such as a thin-film type device, a large-scale device and a flexible device by a roll-to-roll method based on a low cost and easiness of the manufacturing process, which are the biggest advantages of the organic material.

Typically, the organic photovoltaic cell includes a photoactive layer consisting of a junction structure of electron donor and electron acceptor materials.

When light is incident to the photoactive layer, an electron and hole pair is excited in the electron donor, and the separation of electrons and holes occurs as the electron moves to the electron acceptor. Accordingly, carriers produced by light produce electric power as the carriers are separated into electrons-holes, and then move to an external circuit.

For the aforementioned reasons, recent interests have been focused on a bulk heterojunction organic photovoltaic cell which is low in price and may be applied to a flexible substrate.

US Patent Application Publication No. 2006-0011233 discloses an organic photovoltaic cell in which poly(3-hexylthiophene) (P3HT) as an electron donor and [6,6]-phenyl-C61-butyric acid methyl ester (PCBM) as an electron acceptor are used, and a photoactive layer is introduced by a spin-coating method, but the energy conversion efficiency thereof is not very high.

DETAILED DESCRIPTION OF THE INVENTION

Technical Problem

The present specification relates to a photoactive layer, an organic photovoltaic cell comprising the same, and a manufacturing method thereof.

Technical Solution

An exemplary embodiment of the present specification provides an organic photovoltaic cell comprising: a first electrode; a second electrode provided to be opposite to the first electrode; and a photoactive layer disposed between the first electrode and the second electrode, in which the photoactive layer comprises an electron acceptor, an electron donor, and a compound comprising a functional group decreasing a surface energy.

An exemplary embodiment of the present specification provides a photoactive layer comprising an electron acceptor and an electron donor, in which the photoactive layer comprises a compound further comprising a functional group decreasing a surface energy of the electron acceptor.

Another exemplary embodiment of the present specification provides a method for manufacturing an organic photovoltaic cell, the method comprising: preparing a substrate; forming a first electrode in a region of the substrate; forming an organic material layer comprising a photoactive layer on an upper portion of the first electrode; and forming a second electrode on an upper portion of the organic material layer, in which the photoactive layer comprises an electron acceptor, an electron donor, and a compound comprising a functional group decreasing a surface energy of the electron acceptor.

Advantageous Effects

An organic photovoltaic cell according to an exemplary embodiment of the present specification introduces a compound comprising a functional group decreasing the surface energy of an electron acceptor inside a photoactive layer, thereby uniformly distributing the electron acceptor and an electron donor inside the photoactive layer. In this case, the morphology of the photoactive layer may be adjusted, thereby increasing a short-circuit current density and a fill factor. Therefore, an organic photovoltaic cell having a high efficiency may be provided.

BRIEF DESCRIPTION OF DRAWINGS

FIG. 1 is a view illustrating a relative ratio of sulfur/oxygen atoms on a surface of a P3HT/PCBM film according to the content of a compound comprising a functional group decreasing the surface energy of an electron acceptor.

BEST MODE

Hereinafter, the present specification will be described in detail.

An exemplary embodiment of the present specification provides an organic photovoltaic cell comprising: a first electrode; a second electrode provided to be opposite to the first electrode; and a photoactive layer disposed between the first electrode and the second electrode, in which the photoactive layer comprises an electron acceptor, an electron donor, and a compound comprising a functional group decreasing a surface energy.

In the present specification, the electron donor generally means having a negative charge or a non-covalent electron pair, and donating electrons to a portion in which a positive charge or an electron pair lacks. Additionally, the electron donor comprises those capable of transferring an excited electron as an electron acceptor having large electron negativity due to excellent electron-retention properties of the molecule itself when accepting light in a mixed state with an electron acceptor even though not having a negative charge or non-covalent electron pair.

In the present specification, the electron acceptor means those accepting electrons from the electron donor.

In the present specification, the surface energy means a surface tension of the solid, and may be calculated by dropping a specific solvent to measure the contact angle. A method for obtaining the surface energy by measuring the contact angle is a method generally used in the art.

In an exemplary embodiment of the present specification, the compound comprising a functional group decreasing the surface energy is not combined with the electron acceptor or electron donor, and thus does not affect the function of the electron donor or electron acceptor.

Further, in an exemplary embodiment of the present specification, the compound comprising a functional group decreasing the surface energy does not affect the function of the electron acceptor or electron donor. In addition, the compound comprising a functional group decreasing the surface energy decreases the surface energy without serving as accepting or donating electrons.

In an exemplary embodiment of the present specification, the compound comprising a functional group decreasing the surface energy may have affinity for the electron acceptor compared to the electron donor, thereby selectively decreasing the surface energy of the electron acceptor.

In an exemplary embodiment of the present specification, the compound comprising a functional group decreasing the surface energy decreases the surface energy of the electron acceptor.

When the surface energy of the electron acceptor is selectively decreased, prevented is a phenomenon in which the electron donor is closely packed on the surface of the photoactive layer because the surface energy is relatively low. Furthermore, the difference in surface energy between the electron acceptor and the electron donor may be reduced to allow the electron acceptor and the electron donor to be uniformly distributed inside the photoactive layer, thereby providing the appropriate morphology of the photoactive layer. In this case, an organic photovoltaic cell having a high efficiency may be provided.

In an exemplary embodiment of the present specification, when a compound comprising a functional group decreasing the surface energy is put into the photoactive layer, the surface energy of the electron acceptor is different from the surface energy of the electron donor by 0.1% to 30%.

In an exemplary embodiment of the present specification, the compound comprising a functional group decreasing the surface energy is a solid compound at normal temperature, and remains inside the photoactive layer even after the photoactive layer is prepared.

That is, the compound comprising a functional group decreasing the surface energy according to an exemplary embodiment of the present specification does not act as a solvent which dissolves the electron acceptor and the electron donor.

The compound comprising a functional group decreasing the surface energy remains inside the photoactive layer to allow the electron acceptor and the electron donor to be uniformly distributed, thereby serving to control the morphology of the photoactive layer.

In an exemplary embodiment of the present specification, the compound comprising a functional group decreasing the surface energy is present in an amount of 0.25 wt % to 1 wt % based on the weight of the electron acceptor.

Within the range, the surface energy of the electron acceptor may be controlled similarly to the surface energy of the electron donor. Accordingly, the difference in surface energy between the electron acceptor and the electron donor may be reduced to allow the electron acceptor and the electron donor to be uniformly distributed inside the photoactive layer, thereby imparting an effect of decreasing the surface roughness of the photoactive layer.

FIG. 1 is a view illustrating a relative ratio of sulfur/oxygen atoms on a surface of a P3HT/PCBM film according to the content of a compound comprising a functional group decreasing the surface energy of an electron acceptor.

Specifically, the ratio of sulfur atoms in the P3HT and oxygen atoms in the PCBM was measured by the secondary ion mass spectroscopy (SIMS).

As illustrated in FIG. 1, the film surface of the photoactive layer which does not comprise the compound comprising a functional group decreasing the surface energy has a ratio of sulfur/oxygen atoms, which is close to about 2 times. It can be confirmed that the electron donor (P3HT) is present on the surface. When the compound comprising the functional group decreasing the surface energy is comprised, it can be confirmed that the ratio of sulfur/oxygen is reduced.

Further, it can be confirmed that the contents of sulfur and oxygen on the surface of the photoactive layer are similar to each other in a range from 0.25 wt % to 1 wt % of the compound comprising a functional group decreasing the surface energy (2,2,3,3,4,4,4-heptafluoro-N-phenyl-butyl-amide). It can be proven that the electron acceptor and the electron donor are uniformly distributed.

In an exemplary embodiment of the present specification, the functional group decreasing the surface energy contains at least one fluoro group (F).

In an exemplary embodiment of the present specification, the functional group decreasing the surface energy comprises a substituted or unsubstituted alkyl group having 1 to 20 carbon atoms, and at least one fluoro group in the alkyl group is substituted.

In an exemplary embodiment of the present specification, the compound comprising a functional group decreasing the surface energy provides a compound represented by the following Formula 1.

$$Ar-L-R \quad \text{[Formula 1]}$$

Wherein, Ar is a substituted or unsubstituted aryl group; or a substituted or unsubstituted heterocyclic group, L is a direct bond; a substituted or unsubstituted divalent amide group; a substituted or unsubstituted alkylene group;

a substituted or unsubstituted arylene group; or a substituted or unsubstituted divalent heterocyclic group comprising one or more of N, O and S atoms, and R is an alkyl group having 1 to 20 carbon atoms, which is substituted with at least one fluoro group.

In an exemplary embodiment of the present specification, Ar is a substituted or unsubstituted naphthyl group.

In an exemplary embodiment of the present specification, Ar is a substituted or unsubstituted fluorenyl group.

In an exemplary embodiment of the present specification, Ar is a substituted or unsubstituted phenyl group.

In an exemplary embodiment of the present specification, L is a substituted or unsubstituted divalent amide group.

In an exemplary embodiment of the present specification, L is a substituted or unsubstituted alkylene group.

In an exemplary embodiment of the present specification, L is an alkylene group substituted with a fluoro group.

In an exemplary embodiment of the present specification, L is a direct bond.

In an exemplary embodiment of the present specification, R is an alkyl group substituted with at least one fluoro group.

In an exemplary embodiment of the present specification, R is a heptafluoropropyl group.

In an exemplary embodiment of the present specification, R is a nonafluorobutyl group.

In an exemplary embodiment of the present specification, the compound represented by Formula 1 provides a compound represented by any one of the following Formulae 1-1 to 1-5, but is not limited thereto.

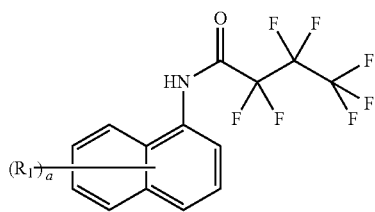

[Formula 1-1]

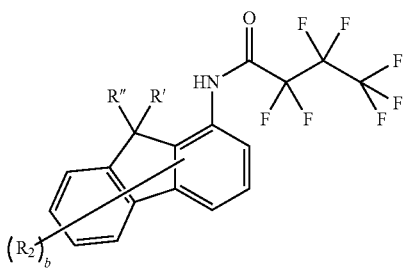

[Formula 1-2]

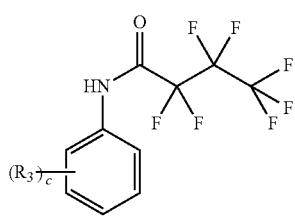

[Formula 1-3]

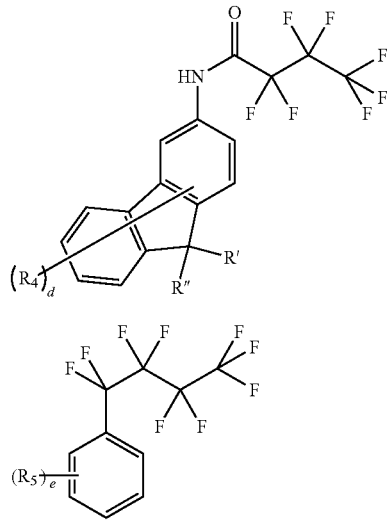

[Formula 1-4]

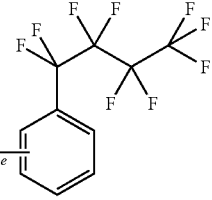

[Formula 1-5]

wherein, a, b and d are each an integer of 0 to 7, c and e are each an integer of 0 to 5, and $R_1$ to $R_5$, and R' and R" are the same as or different from each other, and are each independently hydrogen; a substituted or unsubstituted alkyl group; a substituted or unsubstituted alkoxy group; a substituted or unsubstituted alkenyl group; a substituted or unsubstituted aryl group; or a substituted or unsubstituted heterocyclic group comprising one or more of N, O and S atoms.

Examples of the substituents will be described below, but are not limited thereto.

The "substituted or unsubstituted" in the present specification means being substituted with one or more substituents selected from the group consisting of a halogen group, a nitrile group, a nitro group, a hydroxyl group, an alkyl group, a cycloalkyl group, an alkenyl group, an alkoxy group, an aryloxy group, a thiol group, an alkylthio group, an aryl thio group, a sulfoxy group, an alkylsulfoxy group, an arylsulfoxy group, a silyl group, a boron group, an arylamine group, an aralkylamine group, an alkylamine group, an aryl group, a fluorenyl group, a carbazole group, an arylalkyl group, an arylalkenyl group, a heterocyclic group and an acetylene group, or having no substituent.

In the present specification, the heterocyclic group is a heterocyclic group comprising O, N or S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a quinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a dibenzofuran group and the like, but are not limited thereto.

In the present specification, the alkyl group may be a straight, branched, or cyclic chain.

The number of carbon atoms of the alkyl group is not particularly limited, but is preferably 1 to 25. Specific examples of the alkyl group include a methyl group, an ethyl group, an n-propyl group, an iso-propyl group, an n-butyl group, a sec-butyl group, a t-butyl group, an n-pentyl group, an iso-pentyl group, a neo-pentyl group, an n-hexyl group, a cyclopropyl group, a cyclobutyl group, a cyclopentyl group, a cyclohexyl group and the like, but are not limited thereto.

In the present specification, the alkenyl group may be a straight chain or branched chain, and is preferably an alkenyl group having from 2 to 40 carbon atoms, and specifically, the alkenyl group is preferably an alkenyl group in which an aryl group, such as a stylbenyl group and a styrenyl group, is substituted, but is not limited thereto.

In the present specification, the alkoxy group may be a straight, branched, or cyclic chain. The number of carbon atoms of the alkoxy group is not particularly limited, but is preferably 1 to 25. Specific examples thereof include a methoxy group, an ethoxy group, an n-propyloxy group, an iso-propyloxy group, an n-butyloxy group, a cyclopentyloxy group and the like, but are not limited thereto.

In the present specification, an aryl group may be a monocyclic aryl group or a polycyclic aryl group, and includes the case where an alkyl group having 1 to 25 carbon atoms or an alkoxy group having 1 to 25 carbon atoms is substituted. In addition, the aryl group in the present specification may mean an aromatic ring.

When the aryl group is the monocyclic aryl group, the number of carbon atoms is not particularly limited, but is preferably 6 to 25. Specific examples of the monocyclic aryl group include a phenyl group, a biphenyl group, a terphenyl group, a stilbenyl group and the like, but are not limited thereto.

When the aryl group is the polycyclic aryl group, the number of carbon atoms is not particularly limited, but is preferably 10 to 24. Specific examples of the polycyclic aryl group include a naphthyl group, an anthryl group, a phenanthryl group, a pyrenyl group, a perylenyl group, a chrysenyl group, a fluorenyl group, and the like, but are not limited thereto.

In the present specification, one or two nitrogen atoms of the amide group may be substituted with hydrogen, a straight-chained, branched-chained, or cyclic-chained alkyl group having 1 to 25 carbon atoms, or an aryl group having 6 to 25 carbon atoms. Specifically, the amide group may be compounds having the following Structural Formulae, but is not limited thereto.

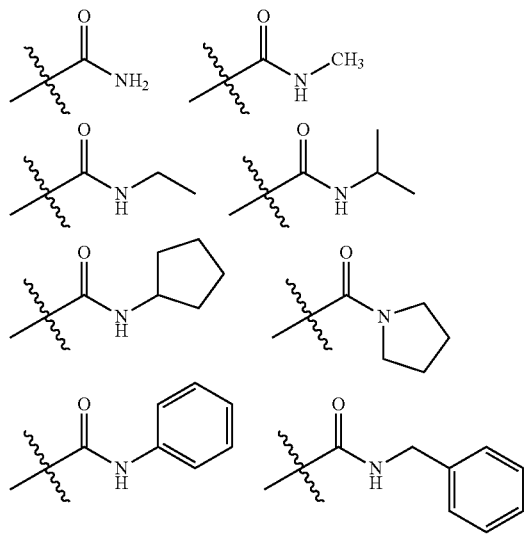

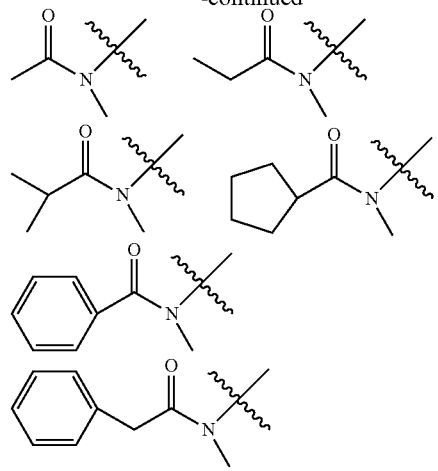

In the present specification, a divalent amide group, an arylene group and a divalent heterocyclic group mean that there are two binding positions in an amide group, an aryl group and a heterocyclic group, respectively. Except that these groups are each a divalent group, the above-described description of the amide group, the aryl group, and the heterocyclic group may be applied to these groups.

In an exemplary embodiment of the present specification, the electron acceptor is a fullerene derivative or a non-fullerene derivative.

In an exemplary embodiment of the present specification, the fullerene derivative is selected from the group consisting of a $C_{60}$ fullerene derivative, a $C_{70}$ fullerene derivative, a $C_{76}$ fullerene derivative, a $C_{78}$ fullerene derivative, a $C_{84}$ fullerene derivative, and a $C_{90}$ fullerene derivative.

In another exemplary embodiment, the non-fullerene derivative has a LUMO energy level of −2.0 to −6.0 eV. In still another exemplary embodiment, the non-fullerene derivative has a LUMO energy level of −2.5 to −5.0 eV. In yet another exemplary embodiment, the non-fullerene derivative has a LUMO energy level of −3.5 to −4.5 eV.

In an exemplary embodiment of the present specification, the electron acceptor is [6,6]-phenyl C-butyric acid methyl ester (PCBM).

In an exemplary embodiment of the present specification, the electron donor is poly(3-hexylthiophene) (P3HT).

In an exemplary embodiment of the present specification, the electron acceptor and the electron donor of the photoactive layer may form a bulk heterojunction (BHJ).

In an exemplary embodiment of the present specification, the photoactive layer has a thickness of 60 nm to 300 nm.

In the present specification, the thickness of the photoactive layer means a width between a surface of the photoactive layer and a surface opposite thereof.

In an exemplary embodiment of the present specification, an organic photovoltaic cell is provided, in which the surface roughness of the photoactive layer is reduced by 30% to 55% than the case where the compound comprising a functional group decreasing the surface energy is not comprised.

The surface roughness of the photoactive layer is affected by heat treatment temperature of the photoactive layer. The surface roughness in the present specification is measured using an atomic force microscopy (AFM).

The roughness in the present specification means an irregular component in which an inherent attribute in the process of manufacturing a photoactive layer left on the surface is present on the surface.

When the surface roughness of the photoactive layer is increased, high contact resistance may be caused. The surface roughness may be decreased by adding a compound comprising a functional group decreasing the surface energy to the organic photovoltaic cell according to an exemplary embodiment of the present specification to decrease the domain size of the electron donor and the electron acceptor.

In an exemplary embodiment of the present specification, the surface energy of the electron acceptor may be decreased by 15% to 55% than the case where the compound comprising a functional group decreasing the surface energy is not comprised.

The electron acceptor of the present specification has a surface energy of 30 mN/m to 48 mN/m.

In an exemplary embodiment of the present specification, the weight ratio of the electron donor and the electron acceptor is 1:0.5 to 1:5.

In an exemplary embodiment of the present specification, the organic photovoltaic cell further comprises one or more of a hole transport layer and a hole injection layer between the first electrode and the photoactive layer.

In an exemplary embodiment of the present specification, the organic photovoltaic cell further comprises an electron transport layer between the second electrode and the photoactive layer.

In an exemplary embodiment of the present specification, the organic photovoltaic cell further comprises an electron transport layer or a hole transport layer between the second electrode and the photoactive layer.

In an exemplary embodiment of the present specification, a photoactive layer is provided in which the photoactive layer is a photoactive layer that further comprises a compound comprising a functional group decreasing the surface energy as a photoactive layer comprising an electron acceptor and an electron donor.

The description on the electron acceptor, the electron donor and the compound comprising a functional group decreasing the surface energy is the same as that described above.

In an exemplary embodiment of the present specification, the compound comprising a functional group decreasing the surface energy decreases the surface energy of the electron acceptor.

In an exemplary embodiment of the present specification, the compound comprising a functional group decreasing the surface energy of the electron acceptor is present in an amount of 0.25 wt % to 1 wt % based on the weight of the electron acceptor.

In another exemplary embodiment, the surface roughness of the photoactive layer is decreased by 30% to 55% than the case where the compound comprising a functional group decreasing the surface energy is not comprised.

In still another exemplary embodiment, the surface energy of the electron acceptor is decreased by 15% to 55% than the case where the compound comprising a functional group decreasing the surface energy is not comprised.

In yet another exemplary embodiment, the surface energy of the electron acceptor is different from that of the electron donor by 0.1% to 30%.

In an exemplary embodiment of the present specification, a first electrode may be an anode electrode or a cathode electrode. Further, a second electrode may be the cathode electrode or the anode electrode.

In an exemplary embodiment of the present specification, in the organic photovoltaic cell, the anode electrode, the photoactive layer, and the cathode electrode may be disposed in this order, or the cathode electrode, the photoactive layer, and the anode electrode may be disposed in this order, but the order is not limited thereto.

In another exemplary embodiment, in the organic photovoltaic cell, the anode electrode, the hole transport layer, the photoactive layer, the electron transport layer, and the cathode electrode may be disposed in this order, or the cathode electrode, the electron transport layer, the photoactive layer, the hole transport layer, and the anode electrode may be disposed in this order, but the order is not limited thereto.

In still another exemplary embodiment, in the organic photovoltaic cell, the anode electrode, the buffer layer, the photoactive layer, and the cathode electrode may be disposed in this order.

An exemplary embodiment of the present specification provides a method for manufacturing an organic photovoltaic cell, the method comprising: preparing a substrate; forming a first electrode in a region of the substrate; forming an organic material layer comprising a photoactive layer on an upper portion of the first electrode; and forming a second electrode on an upper portion of the organic material layer, in which the photoactive layer comprises an electron acceptor, an electron donor, and a compound comprising a functional group decreasing the surface energy of the electron acceptor.

In an exemplary embodiment of the present specification, the compound comprising a functional group decreasing the surface energy of the electron acceptor is present in an amount of 0.25 wt % to 1 wt % based on the weight of the electron acceptor.

The description on the electron acceptor, the electron donor and the compound comprising a functional group decreasing the surface energy is the same as that described above.

The organic photovoltaic cell of the present specification may be manufactured by a material and a method known in the art, except for comprising a compound comprising a functional group decreasing the surface energy in the photoactive layer.

The substrate may be a glass substrate or a transparent plastic substrate having excellent transparency, surface smoothness, easiness in handling, and waterproof, but is not limited thereto, and there is no limitation as long as the substrate is a substrate typically used in the organic photovoltaic cell. Specific examples thereof include glass, PET (polyethylene terephthalate), PEN (polyethylene naphthalate), PP (polypropylene), PI (polyimide), TAC (triacetyl cellulose), or the like, but are not limited thereto.

The anode electrode may be of a material having transparency and excellent conductivity, but is not limited thereto. Specific examples of the anode electrode include metals such as vanadium, chromium, copper, zinc and gold, or alloys thereof; metal oxides such as zinc oxide, indium oxide, indium tin oxide (ITO) and indium zinc oxide (IZO); a combination of metal and oxide, such as $ZnO:Al$ or $SnO_2:Sb$; and electrically conductive polymers, such as poly(3-methylthiophene), poly[3,4-(ethylene-1,2-dioxy)thiophene](PEDOT), polypyrrole and polyaniline, and the like, but are not limited thereto.

A method for forming the anode electrode is not particularly limited, but the anode electrode may be formed by being applied on one surface of the substrate or being coated in the form of a film by using, for example, sputtering, E-beam, thermal deposition, spin coating, screen printing, inkjet printing, doctor blade or a gravure printing method.

When the anode electrode is formed on a substrate, the substrate may be subjected to processes of cleaning, moisture removal and hydrophilic modification.

For example, when a patterned ITO substrate is sequentially washed with a cleaning agent, acetone, and isopropyl alcohol (IPA), dried on a hot plate at 100° C. to 150° C. for 1 to 30 minutes, preferably at 120° C. for 10 minutes in order to remove moisture, and is completely washed, the surface of the substrate is hydrophilically modified.

Through the surface modification as described above, the junction surface potential may be maintained at a level suitable for the surface potential of the photoactive layer. In addition, during the modification, a polymer thin film may be easily formed on the anode electrode, and the quality of the thin film may also be enhanced.

Examples of a pretreatment technology of the anode electrode include a) a surface oxidation method using a parallel plate discharge, b) a method of oxidizing the surface through ozone produced by using UV rays in a vacuum state, c) a method of oxidizing the anode electrode by using an oxygen radical produced by the plasma, and the like.

One of the methods may be selected depending on the state of the anode electrode or the substrate. However, it is preferred that oxygen on the surface of the anode electrode or the substrate is prevented from leaving, and moisture and organic materials are maximally suppressed from remaining commonly even when any of the methods is used. In this case, a substantial effect of the pretreatment may be maximized.

As a specific example, it is possible to use a method of oxidizing the surface through ozone produced by using UV. In this case, after being ultrasonically cleaned, the patterned ITO substrate is baked and well dried on a hot plate, and introduced into a chamber, and then may be washed by ozone produced by actuating a UV lamp to react an oxygen gas with the UV rays.

However, the method of modifying the surface of the patterned ITO substrate in the present specification does not need to be particularly limited, and any method may also be used as long as the method is a method of oxidizing the substrate.

The cathode electrode may be of a metal having a small work function, but is not limited thereto. Specific examples thereof include metal such as magnesium, calcium, sodium, potassium, titanium, indium, yttrium, lithium, gadolinium, aluminum, silver, tin, and lead, or an alloy thereof; and a material having a multilayered structure, such as LiF/Al, $LiO_2$/Al, LiF/Fe, Al:Li, Al:BaF$_2$, and Al:BaF$_2$:Ba, but are not limited thereto.

The cathode electrode may be deposited and formed inside a thermal deposition device exhibiting a degree of vacuum of $5 \times 10^{-7}$ torr or less, but the formation is not limited to the method.

The hole transport layer and/or electron transport layer materials serve to efficiently transfer electrons and holes separated from the photoactive layer to the electrode, and the materials are not particularly limited.

The hole transport layer material may be PEDOT:PSS (poly(3,4-ethylenediocythiophene) doped with poly(styrenesulfonic acid)), molybdenum oxide ($MoO_x$); vanadium oxide ($V_2O_5$); nickel oxide (NiO); tungsten oxide ($WO_x$); and the like, but is not limited thereto.

The electron transport layer material may be electron-extracting metal oxides, and may be specifically a metal complex of 8-hydroxyquinoline; a complex comprising Alq$_3$; a metal complex comprising Liq; LiF; Ca; titanium oxide ($TiO_x$); zinc oxide (ZnO), cesium carbonate ($Cs_2CO_3$), and the like, but is not limited thereto.

The photoactive layer may be formed by dissolving a photoactive material such as an electron donor and/or an electron acceptor in an organic solvent, and then coating the resulting solution by a method such as spin coating, dip coating, screen printing, spray coating, doctor blade and brush painting, but the method is not limited thereto.

The manufacture of the organic photovoltaic cell according to an exemplary embodiment of the present specification will be specifically described in the following Examples. However, the following Examples are provided to illustrate the present specification, but the scope of the present specification is not limited thereby.

Example

Measurement of Surface Energy of Electron Acceptor

The variation of the surface energy of the electron acceptor (PCBM) depending on the amount of the surface energy added is shown in the following Table 1.

The surface energy is obtained by measuring a contact angle for the two solvents of ionized water and glycerol.

TABLE 1

| Amount (wt %) of a compound comprising a functional group decreasing the surface energy added | Surface energy (mN/m) of PCBM |
|---|---|
| 0 | 44.6 |
| 0.25 | 36.7 |
| 0.5 | 34.5 |
| 1 | 30.6 |
| 3 | 27.5 |
| 5 | 23.6 |
| 10 | 20.2 |

It can be confirmed that the surface energy of the electron donor (P3HT) is 32.3 mN/m, which is similar to that of the electron donor when a compound comprising a functional group decreasing the surface energy (2,2,3,3,4,4,4-heptafluoro-N-phenyl-butylamide) is added in an amount of 0.25 wt % to 1 wt %. Since the surface energy of the electron donor is similar to that of the electron acceptor, the electron donor and the electron acceptor may be uniformly distributed inside the photoactive layer.

Measurement of Surface Roughness of Photoactive Layer

The variation of the surface roughness of the photoactive layer depending on the amount of the surface energy added is shown in the following Table 2. The roughness was measured by using an AFM (Atomic Force Microscopy).

TABLE 2

| Amount (wt %) of a compound comprising a functional group decreasing the surface energy added | Surface roughness (nm) of photoactive layer |
|---|---|
| 0 (PCBM/P3HT single film) | 5.92 |
| 0.25 | 3.57 |
| 0.5 | 2.58 |
| 1 | 2.81 |
| 3 | 3.45 |

TABLE 2-continued

| Amount (wt %) of a compound comprising a functional group decreasing the surface energy added | Surface roughness (nm) of photoactive layer |
|---|---|
| 5 | 4.31 |
| 10 | 6.16 |

In the photoactive layer comprising the electron donor (P3HT) and the electron acceptor (PCBM), the domain size of the two materials after the heat treatment becomes large, thereby decreasing the contact area of the electron acceptor and the electron donor.

When an electron donor, an electron acceptor, and a compound (2,2,3,3,4,4,4-heptafluoro-N-phenyl-butylamide) comprising a functional group decreasing the surface energy are included in an amount of 0.25 wt % to 1 wt %, it can be confirmed that the domain size of each material is reduced, thereby decreasing the surface roughness. In this case, the surface contact area between the electron donor and the electron acceptor may be increased.

Measurement of Ratio of Sulfur/Oxygen Atoms on Surface of Photoactive Layer

The ratio of sulfur atoms in the electron donor (P3HT) and oxygen atoms in the electron acceptor (PCBM) was measured by the secondary ion mass spectroscopy (SIMS).

FIG. 1 is a view illustrating a relative ratio of sulfur/oxygen atoms on a surface of a P3HT/PCBM film according to the content of a compound comprising a functional group decreasing a surface energy of an electron acceptor.

As illustrated in FIG. 1, the film surface of the photoactive layer which does not comprise the compound comprising a functional group decreasing the surface energy has a ratio of sulfur/oxygen atoms, which is close to about 2 times. It can be confirmed that the electron donor (P3HT) is present on the surface. When the compound comprising the functional group decreasing the surface energy is comprised, it can be confirmed that the ratio of sulfur/oxygen is reduced. It can be confirmed that the contents of sulfur and oxygen on the surface of the photoactive layer are similar to each other in a range from 0.25 wt % to 1 wt % of the compound comprising a functional group decreasing the surface energy (2,2,3,3,4,4,4-heptafluoro-N-phenyl-butylamide). It can be proved that the electron acceptor and the electron donor are uniformly distributed.

Example 1

[Cleaning of Patterned ITO Substrate]

In order to clean the surface of a patterned ITO glass (Surface resistance ~125 Ω/sq$^2$, Shinan SNP Co., Ltd.) substrate, a cleaning agent (Alconox, Aldrich, USA), acetone and isopropyl alcohol (IPA) were used to ultrasonically clean the substrate in this order each for 20 minutes, residual water was completely blown with nitrogen, and then the substrate was dried at 120° C. on a hot plate for 10 minutes to completely remove moisture. When the patterned ITO substrate was completely cleaned, the surface was hydrophilically modified in an UVO cleaner (Ahtech LTS, Korea) for 10 minutes.

[Manufacture of Hole Transfer Layer]

After isopropyl alcohol (IPA) was mixed with poly(3,4-etheylenedioxythiophene):poly(4-styrenesulfonate) (PEDOT:PSS_Clevious P AI 4083) at a ratio of 1:2, the mixture was spin-coated in a thickness of about 30 nm, and then thermal treatment was performed at 180° C. on a hot plate for 12 minutes.

[Manufacture of Photoactive Layer]

Poly-3-hexylthiophene (P3HT) was used as the electron donor, and [6,6]-phenyl C60-butyric acid methyl ester (PCBM) was used as the electron acceptor. 2,2,3,3,4,4,4-heptafluoro-N-phenyl-butylamide was added in an amount of 0.25 wt % based on the weight of PCBM to a photoactive layer material in which P3HT and PCBM(60) were mixed in a weight ratio of 1:1, the mixture was dissolved in a solvent in which 1,2-dichlorobenzene and chlorobenzene were mixed in a ratio of 9:1, and the resulting solution was spin-coated on the upper portion of the PEDOT:PSS layer to form a photoactive layer having a thickness of 230 nm.

[Manufacture of Electrode]

After the photoactive layer was manufactured, Ca was deposited in a thickness of 3 nm inside a thermal deposition device, and an aluminum electrode was deposited in a thickness of 100 nm, thereby manufacturing an organic photovoltaic cell having an area of 0.04 cm$^2$.

Example 2

The process was performed in the same manner as in Example 1, except that 2,2,3,3,4,4,4-heptafluoro-N-phenyl-butylamide was mixed in an amount of 0.5 wt % based on the weight of PCBM during the manufacture of the photoactive layer.

Example 3

The process was performed in the same manner as in Example 1, except that 2,2,3,3,4,4,4-heptafluoro-N-phenyl-butylamide was mixed in an amount of 1 wt % based on the weight of PCBM during the manufacture of the photoactive layer.

Example 4

The process was performed in the same manner as in Example 1, except that 2,2,3,3,4,4,4-heptafluoro-N-phenyl-butylamide was mixed in an amount of 3.0 wt % based on the weight of PCBM during the manufacture of the photoactive layer.

Example 5

The process was performed in the same manner as in Example 1, except that 2,2,3,3,4,4,4-heptafluoro-N-phenyl-butylamide was mixed in an amount of 5.0 wt % based on the weight of PCBM during the manufacture of the photoactive layer.

Example 6

The process was performed in the same manner as in Example 1, except that 2,2,3,3,4,4,4-heptafluoro-N-phenyl-butylamide was mixed in an amount of 10.0 wt % based on the weight of PCBM during the manufacture of the photoactive layer.

Comparative Example 1

The process was performed in the same manner as in Example 1, except that 2,2,3,3,4,4,4-heptafluoro-N-phenyl-butylamide was not added during the manufacture of the photoactive layer.

Evaluation of Characteristics of Organic Photovoltaic Cell

In order to measure electro-optical characteristics of the organic photovoltaic cells manufactured in Examples 1 to 6 and Comparative Example 1, a current-voltage density was measured under the standard conditions (Air mass 1.5 Clobal, 100 mW/cm$^2$) using an Oriel solar simulator (class AAA).

The photo short-circuit current density ($J_{sc}$), the photo open circuit voltage ($V_{oc}$), the fill factor (FF) and the energy conversion efficiency of the organic photovoltaic cell are shown in the following Table 3.

In this case, the fill factor was calculated as the voltage value ($V_{max}$)*the current density ($J_{max}$) ($V_{oc}$*$j_{sc}$) at the maximum power point, and the energy conversion efficiency was calculated as FF*($J_{sc}$*$V_{oc}$)/$P_{in}$, $P_{in}$=100[mW·cm$^2$].

TABLE 3

| | Content (wt %) | $J_{sc}$ (mA/cm$^2$) | $V_{oc}$ (V) | FF (%) | PCE (%) |
|---|---|---|---|---|---|
| Example 1 | 0.25 | 11.6 | 0.63 | 54.9 | 4.0 |
| Example 2 | 0.5 | 12.6 | 0.63 | 55.8 | 4.4 |
| Example 3 | 1 | 12.5 | 0.63 | 55.2 | 4.3 |
| Example 4 | 3 | 11.1 | 0.63 | 54.2 | 3.8 |
| Example 5 | 5 | 11.0 | 0.63 | 55.7 | 3.8 |
| Example 6 | 10 | 11.0 | 0.63 | 50.7 | 3.5 |
| Comparative Example 1 | 0 | 10.5 | 0.63 | 49.4 | 3.2 |

In Table 1, the content means a content compared to the electron acceptor (PCBM) of 2,2,3,3,4,4,4-heptafluoro-N-phenyl-butylamide, $J_{sc}$ means the short-circuit current density, FF means a fill factor, and PCE means a photoelectric conversion efficiency. The open circuit voltage and the short-circuit current are the intercepts of the X-axis and the Y-axis in the fourth quadrant of the voltage-current density curve, respectively, and as the two values becomes high, the efficiency of the photovoltaic cell is preferably increased. In addition, the fill factor is a value obtained by dividing the width of a rectangle which may be drawn inside the curve by the product of the short-circuit current and the open circuit voltage. When the three values are divided by the intensity of light irradiated, the energy conversion efficiency may be obtained, and the higher value is preferred.

As shown in Table 1, the photoelectric conversion efficiency in Comparative Example 1 was 3.2%, whereas the photoelectric conversion efficiency was increased in Examples 1 to 6 in which the compound comprising a functional group decreasing the surface energy is added. In particular, when the content of the compound comprising a functional group decreasing the surface energy is 0.25 wt % to 1 wt %, it can be confirmed that the photoelectric conversion efficiency is increased by about 25% or more. Furthermore, when the compound comprising a functional group decreasing the surface energy is added, it can be confirmed that the short-circuit current density is also increased.

The invention claimed is:

1. An organic photovoltaic cell comprising:
   a first electrode;
   a second electrode provided to be opposite to the first electrode; and
   a photoactive layer disposed between the first electrode and the second electrode,
   wherein the photoactive layer comprises an electron acceptor, an electron donor, and a compound comprising a functional group decreasing a surface energy, and the compound comprising a functional group decreasing a surface energy is a compound represented by the following Formula 1:

Ar-L-R     [Formula 1]

wherein, Ar is a substituted or unsubstituted aryl group; or a substituted or unsubstituted heterocyclic group, L is a direct bond; a substituted or unsubstituted divalent amide group; a substituted or unsubstituted alkylene group; a substituted or unsubstituted arylene group; or a substituted or unsubstituted divalent heterocyclic group comprising one or more of N, O and S atoms, and R is an alkyl group having 1 to 20 carbon atoms, which is substituted with at least one fluoro group.

2. The organic photovoltaic cell of claim 1, wherein the compound comprising a functional group decreasing a surface energy decreases a surface energy of the electron acceptor.

3. The organic photovoltaic cell of claim 1, wherein the compound comprising a functional group decreasing a surface energy is present in an amount of 0.25 wt % to 1 wt % based on a weight of the electron acceptor.

4. The organic photovoltaic cell of claim 1, wherein a surface energy of the electron acceptor is different from that of the electron donor by 0.1% to 30%.

5. The organic photovoltaic cell of claim 1, wherein the compound comprising a functional group decreasing a surface energy is a solid at room temperature.

6. The organic photovoltaic cell of claim 1, wherein the compound represented by Formula 1 is a compound represented by any one of the following Formulae 1-1 to 1-5:

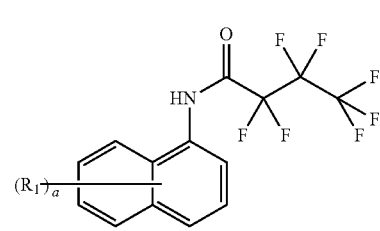

[Formula 1-1]

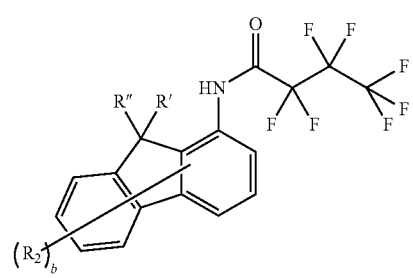

[Formula 1-2]

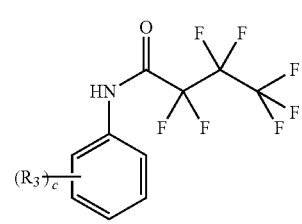

[Formula 1-3]

-continued

[Formula 1-4]

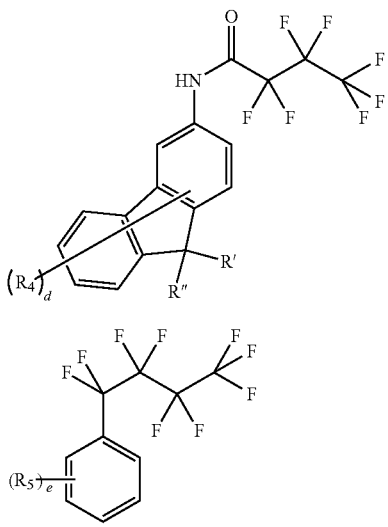

[Formula 1-5]

wherein,
a, b and d are each a number of R1, R2 and R4 which are not a hydrogen, and are an integer of 0 to 7,
c and e are each a number of R3 and R5 which are not a hydrogen, and are an integer of 0 to 5, and
R1 to R5, and R' and R'' are the same as or different from each other, and are each independently hydrogen; a substituted or unsubstituted alkyl group; a substituted or unsubstituted alkoxy group; a substituted or unsubstituted alkenyl group; a substituted or unsubstituted aryl group; or a substituted or unsubstituted heterocyclic group comprising one or more of N, O and S atoms.

7. The organic photovoltaic cell of claim 1, wherein the photoactive layer has a thickness of 60 nm to 300 nm.

8. The organic photovoltaic cell of claim 1, wherein a surface roughness of the photoactive layer is reduced by 30% to 55% than the case where the compound comprising a functional group decreasing the surface energy is not comprised.

9. The organic photovoltaic cell of claim 1, wherein a weight ratio of the electron donor and the electron acceptor is 1:0.5 to 1:5.

10. The organic photovoltaic cell of claim 1, wherein the organic photovoltaic cell further comprises one or more of an hole transport layer and a hole injection layer between the first electrode and the photoactive layer.

11. The organic photovoltaic cell of claim 1, wherein the organic photovoltaic cell further comprises an electron transport layer or a hole transport layer between the second electrode and the photoactive layer.

12. A method for manufacturing an organic photovoltaic cell, the method comprising:
preparing a substrate;
forming a first electrode in a region of the substrate;
forming an organic material layer comprising a photoactive layer on an upper portion of the first electrode; and
forming a second electrode on an upper portion of the organic material layer,
wherein the photoactive layer comprises an electron acceptor, an electron donor, and a compound comprising a functional group decreasing a surface energy of the electron acceptor, and
the compound comprising a functional group decreasing a surface energy is a compound represented by the following Formula 1:

Ar-L-R [Formula 1]

wherein, Ar is a substituted or unsubstituted aryl group; or a substituted or unsubstituted heterocyclic group,
L is a direct bond; a substituted or unsubstituted divalent amide group; a substituted or unsubstituted alkylene group; a substituted or unsubstituted arylene group; or a substituted or unsubstituted divalent heterocyclic group comprising one or more of N, O and S atoms, and
R is an alkyl group having 1 to 20 carbon atoms, which is substituted with at least one fluoro group.

13. The method of claim 12, wherein the compound comprising a functional group decreasing a surface energy of the electron acceptor is present in an amount of 0.25 wt % to 1 wt % based on a weight of the electron acceptor.

* * * * *